US012484233B2

(12) United States Patent
Eun et al.

(10) Patent No.: US 12,484,233 B2
(45) Date of Patent: Nov. 25, 2025

(54) VARIABLE RESISTANCE MEMORY DEVICE

(71) Applicant: SAMSUNG ELECTRONICS CO., LTD., Suwon-si (KR)

(72) Inventors: Sung-Ho Eun, Suwon-si (KR); Yu Na Gil, Suwon-si (KR); Su Min Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 374 days.

(21) Appl. No.: 18/104,890

(22) Filed: Feb. 2, 2023

(65) Prior Publication Data

US 2023/0354617 A1 Nov. 2, 2023

(30) Foreign Application Priority Data

Apr. 27, 2022 (KR) .................. 10-2022-0051790

(51) Int. Cl.
*H10B 63/00* (2023.01)
*H10B 63/10* (2023.01)

(52) U.S. Cl.
CPC ............ *H10B 63/80* (2023.02); *H10B 63/10* (2023.02); *H10B 63/24* (2023.02)

(58) Field of Classification Search
CPC ........ H10B 63/80; H10B 63/10; H10B 63/24; H10B 63/20; H10B 63/84; H10N 70/882; H10N 70/231; H10N 70/826; H10N 70/821; G11C 13/0004
See application file for complete search history.

(56) References Cited

U.S. PATENT DOCUMENTS

| 7,265,050 | B2 | 9/2007 | Choi et al. |
| 8,686,392 | B2 | 4/2014 | Tsukamoto |
| 9,991,316 | B2 | 6/2018 | Zuliani et al. |
| 10,181,444 | B2 | 1/2019 | Kang et al. |
| 11,195,998 | B2 | 12/2021 | Sarpatwari et al. |
| 2010/0181549 | A1 | 7/2010 | Kim et al. |
| 2021/0183950 | A1* | 6/2021 | Cho ................. H10N 70/8836 |
| 2021/0305508 | A1 | 9/2021 | Lee et al. |
| 2022/0246681 | A1* | 8/2022 | Parekh ................... H01L 25/16 |

FOREIGN PATENT DOCUMENTS

| KR | 10-0827697 B1 | 5/2008 |
| KR | 1020210077316 A | 6/2021 |

* cited by examiner

*Primary Examiner* — Allison Bernstein
(74) *Attorney, Agent, or Firm* — Muir Patent Law, PLLC

(57) ABSTRACT

A variable resistance memory device includes a substrate, a cell array region including a plurality of memory cells on the substrate, a wiring region which includes an inter-wiring insulating film stacked on the cell array region, and an upper wiring structure in the inter-wiring insulating film and a protective film which covers an upper surface of the cell array region, between the cell array region and the wiring region, wherein each of the memory cells includes a switching pattern and a variable resistance pattern, the cell array region further includes first conductive lines extending in a first direction, and a second conductive lines extending in a second direction intersecting the first direction, and the plurality of memory cells are disposed at an intersections of the first conductive lines and the second conductive lines.

18 Claims, 13 Drawing Sheets

VARIABLE RESISTANCE MEMORY DEVICE

CROSS-REFERENCE TO RELATED APPLICATION

This application claims priority from Korean Patent Application No. 10-2022-0051790, filed on Apr. 27, 2022, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor device, and more specifically, to a variable resistance memory device.

2. Description of the Related Art

As electronic devices gradually become highly integrated, high-performance memory devices having a rapid operation and a low operating voltage are required. In recent years, variable resistance memory devices having variable resistance characteristics have been developed as new memory devices. For example, a phase change random access memory (PRAM) device, a magnetic random access memory (MRAM) device, a resistive random access memory (RRAM), and the like have been studied as the variable resistance memory device.

SUMMARY

According to an aspect of the present disclosure, there is provided a variable resistance memory device including, a substrate a cell array region including a plurality of memory cells on the substrate, a wiring region which includes an inter-wiring insulating film stacked on the cell array region, and an upper wiring structure in the inter-wiring insulating film and a protective film which covers an upper surface of the cell array region, between the cell array region and the wiring region, wherein each of the memory cells includes a switching pattern and a variable resistance pattern, the cell array region further includes first conductive lines extending in a first direction, and a second conductive lines extending in a second direction intersecting the first direction, and the plurality of memory cells are disposed at an intersections of the first conductive lines and the second conductive lines.

According to another aspect of the present disclosure, there is provided a variable resistance memory device including, a substrate, a cell array region in which a plurality of memory cells each including a switching pattern and a variable resistance pattern are disposed on the substrate, a wiring region which includes an inter-wiring insulating film stacked on the cell array region, and an upper wiring structure in the inter-wiring insulating film, a protective film which covers an upper surface of the cell array region, between the cell array region and the wiring region and a through via which penetrates the protective film and is electrically connected to the upper wiring structure, wherein the protective film includes at least one of aluminum oxide, silicon nitride, and a combination thereof.

According to still another aspect of the present disclosure, there is provided a variable resistance memory device including, a peripheral circuit region which includes a substrate, a peripheral circuit element on the substrate, and a lower wiring structure connected to the peripheral circuit elements on the substrate, a cell array region which includes a first conductive lines extending in a first direction, a second conductive lines extending in a second direction intersecting the first direction, and a plurality of memory cells disposed at an intersections of the first conductive lines and the second conductive lines, on the peripheral circuit region, a first via contact which connects the first conductive lines and the lower wiring structure, a second via contact which connects the second conductive lines and the lower wiring structure, a protective film which covers an upper surface of the cell array region, a wiring region which includes an inter-wiring insulating film stacked on the protective film, and an upper wiring structure inside the inter-wiring insulating film and a through via which connects the lower wiring structure and the upper wiring structure, wherein each of the memory cells includes a switching pattern and a variable resistance pattern.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a variable resistance memory device according to the exemplary embodiments will be described referring to FIGS. 1 to 14.

Figure 1:
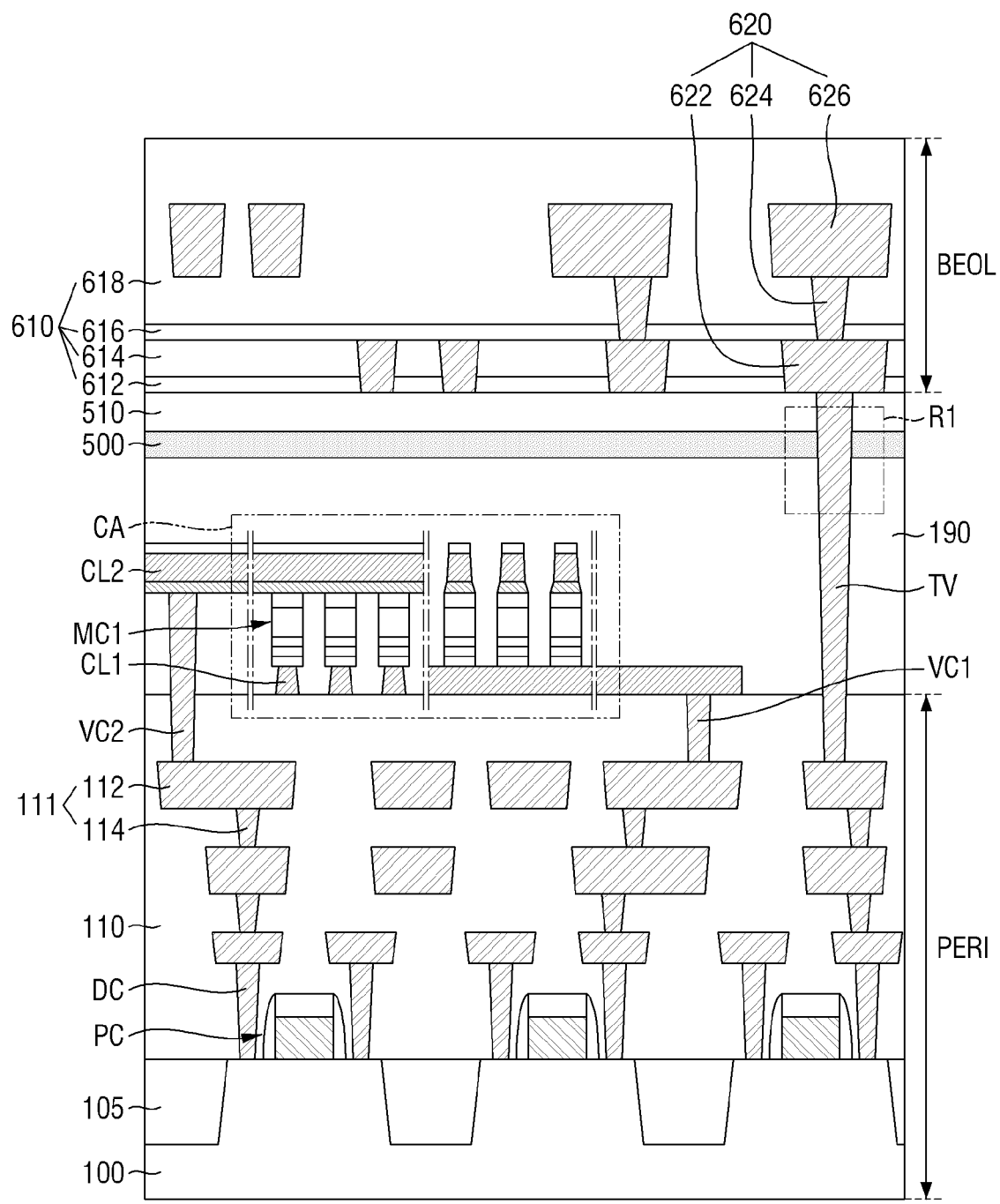
FIG. 1 is a schematic cross-sectional drawing of a variable resistance memory device according to some embodiments.
Figure 2:
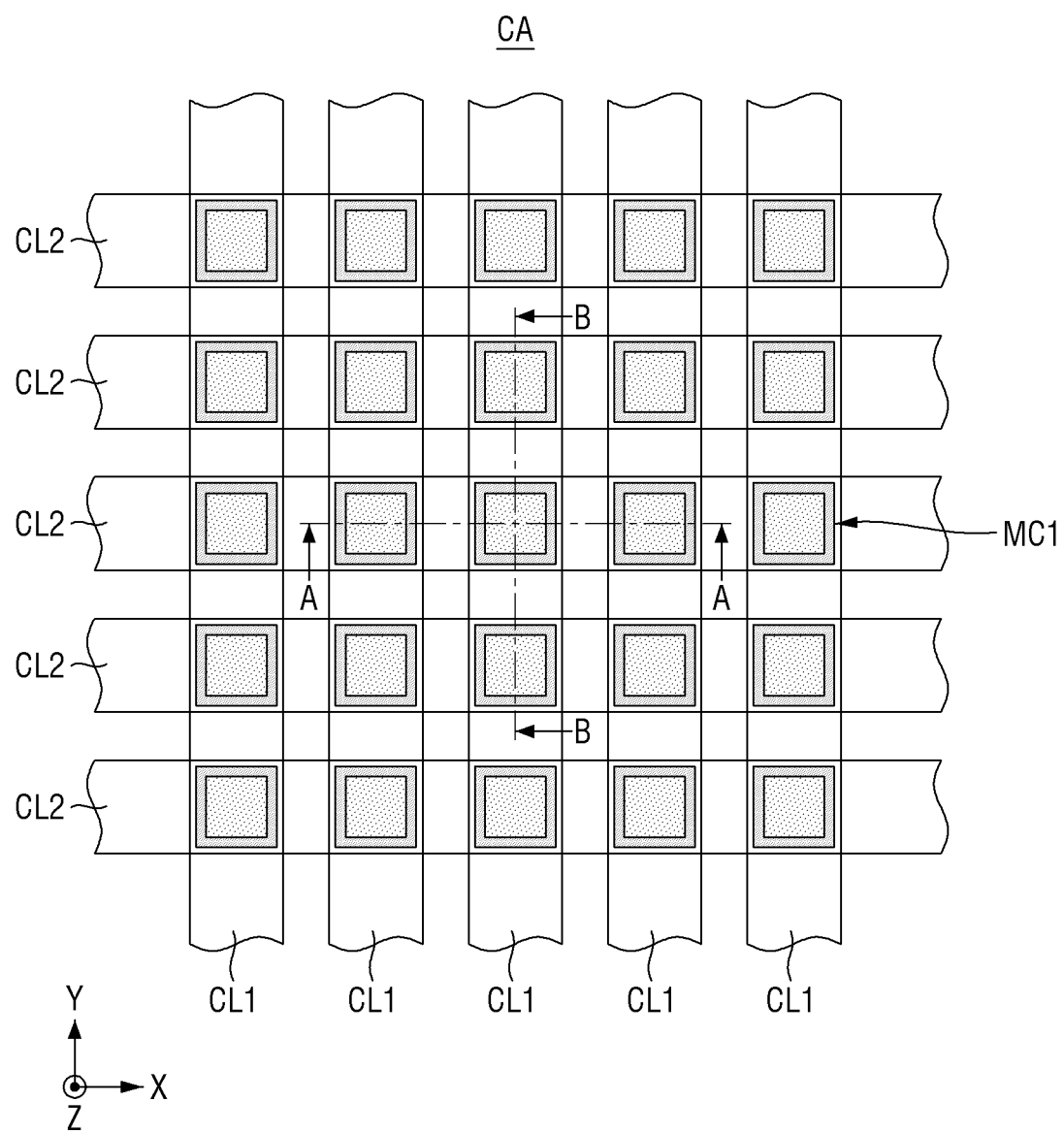
FIG. 2 is a layout diagram of the cell array region of FIG. 1.
Figure 3:
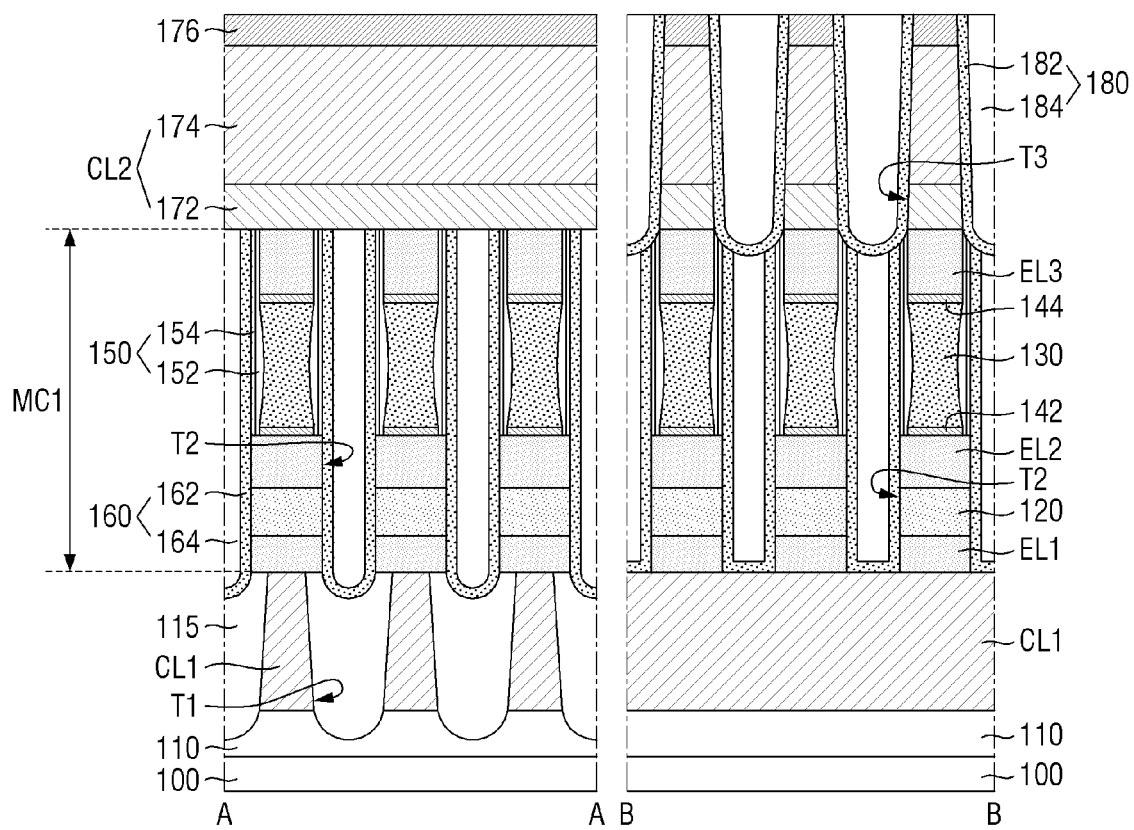
FIG. 3 is a cross-sectional view taken along lines A-A and B-B of FIG. 2.
Figure 4:
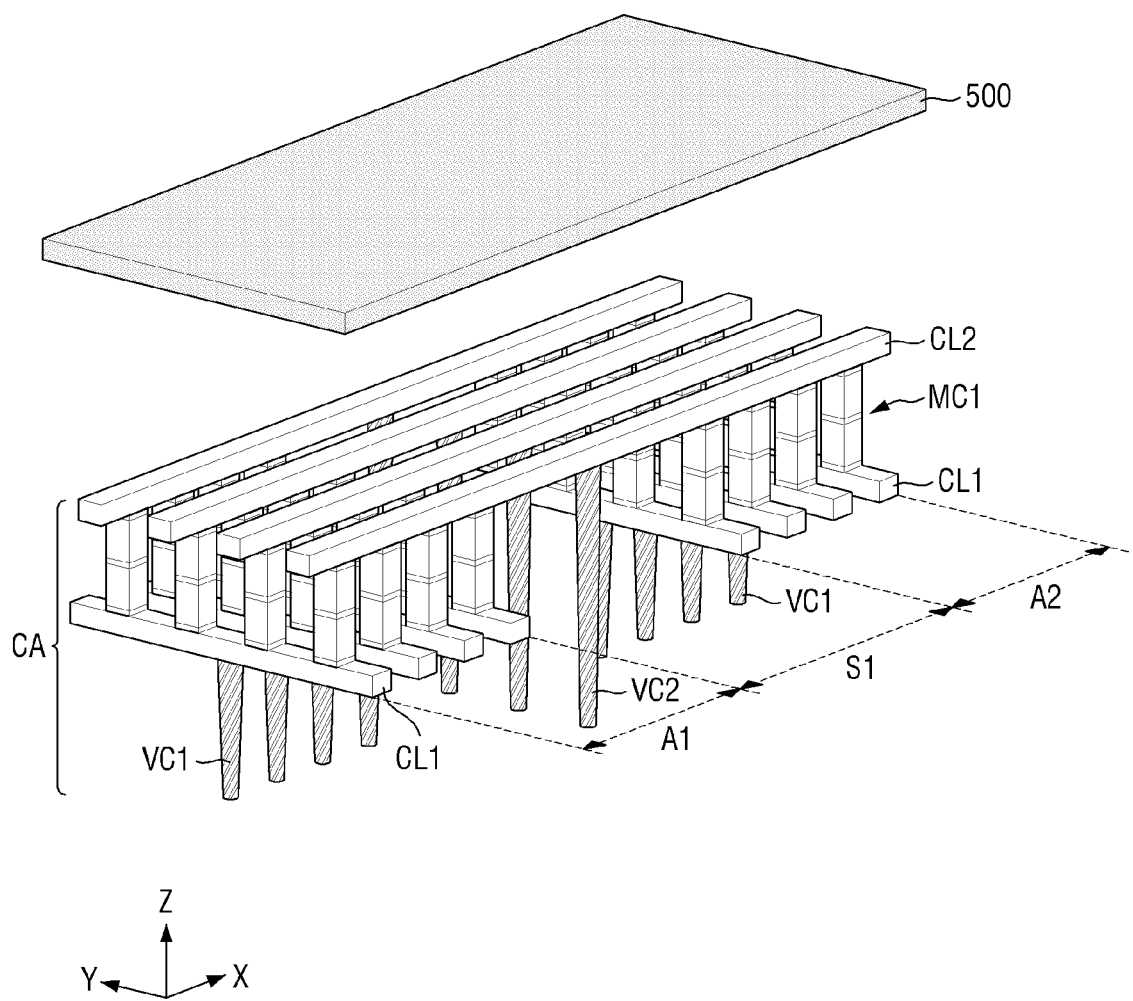
FIG. 4 is a conceptual diagram of the cell array region of FIGS. 2 and 3.
Figure 5:
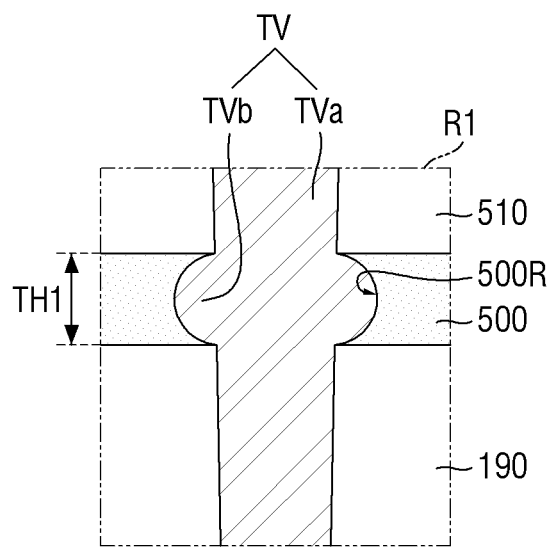
FIGS. 5 and 6 are various enlarged views of region R1 of FIG. 1.
Figure 6:
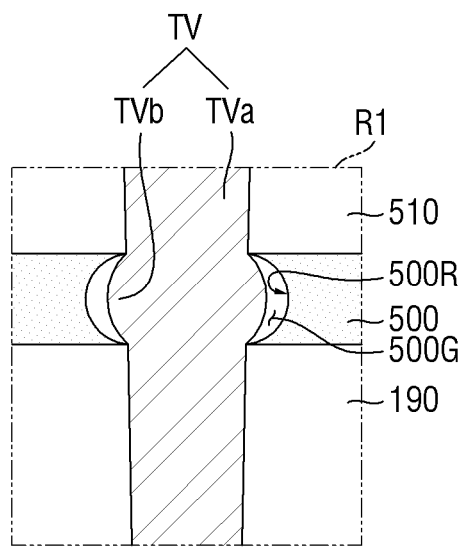

FIG. 1 is a schematic cross-sectional drawing for explaining a variable resistance memory device according to some embodiments. FIG. 2 is an exemplary layout diagram for explaining the cell array region of FIG. 1. FIG. 3 is a cross-sectional view taken along lines A-A and B-B of FIG. 2. FIG. 4 is a conceptual diagram for explaining the cell array region of FIGS. 2 and 3. FIGS. 5 and 6 are various enlarged views for explaining region R1 of FIG. 1.

Referring to FIGS. 1 to 6, a variable resistance memory device according to some embodiments may include a peripheral circuit region PERI, a cell array region CA, a protective film 500, and a wiring region BEOL. For example, as illustrated in FIG. 1, the peripheral circuit region PERI, the cell array region CA, the protective film 500, and the wiring region BEOL may be sequentially stacked, in the stated order, on top of each other along a vertical direction.

The peripheral circuit region PERI may include a substrate 100, a peripheral circuit element PC, a lower insulating film 110, and a lower wiring structure 111.

For example, the substrate 100 may include semiconductor substrate, e.g., a silicon substrate, a germanium substrate or a silicon-germanium substrate. In another example, the substrate 100 may include a silicon-on-insulator (SOI) substrate, a germanium-on-insulator (GOI) substrate, or the like.

The peripheral circuit element PC may be formed on the substrate 100. The peripheral circuit element PC may include control elements and dummy elements, and may control the function of first memory cells MC1 formed in the cell array region CA to be described later. For example, the peripheral circuit element PC may configure various circuit elements for controlling the function of the first memory cell MC1. For example, the peripheral circuit element PC may include various active elements, e.g., a transistor, and various passive elements, e.g., a capacitor, a resistor, and an inductor.

In some embodiments, an element separation pattern 105 may be formed inside the substrate 100. The element separation pattern 105 may be formed by embedding an insulating material inside a shallow trench formed in the substrate 100. Such an element separation pattern 105 may separate a plurality of peripheral circuit elements PC formed on the substrate 100 from each other. The element separation pattern 105 may include, e.g., at least one of silicon oxide, silicon nitride and silicon oxynitride.

The lower insulating film 110 may be formed on the substrate 100 and the peripheral circuit element PC. The lower wiring structure 111 may have a multilayer structure formed inside the lower insulating film 110. For example, the lower wiring structure 111 may include lower wiring patterns 112 of a multi-layer structure, and lower via patterns 114 interconnecting the lower wiring patterns 112. The placement, the number of layers, and the like of the lower wiring patterns 112 and the lower via patterns 114 are merely exemplary and are not limited to those shown.

In some embodiments, the lower wiring structure 111 may include a conductive film and a barrier film for preventing the diffusion of elements included in the conductive film. For example, the conductive film may include metal materials, e.g., tungsten (W), aluminum (Al) or copper (Cu). For example, the barrier film may include metal or metal nitrides, e.g., titanium (Ti), titanium nitride (TiN), tantalum (Ta) or tantalum nitride (TaN).

The lower wiring structure 111 may be electrically connected to the peripheral circuit element PC. For example, a direct contact DC that connects the peripheral circuit element PC and the lower wiring structure 111 may be formed inside the lower insulating film 110. The direct contact DC may extend in the vertical direction (hereinafter, a third direction Z) intersecting an upper surface of the substrate 100 to electrically connect the peripheral circuit element PC and the lower wiring structure 111. In some embodiments, the direct contact DC may connect the wiring pattern placed at the lowermost part among the lower wiring patterns 112 to the peripheral circuit element PC.

The cell array region CA may be formed on the substrate 100. In some embodiments, the cell array region CA may be stacked on the peripheral circuit region PERI. That is, the variable resistance memory device according to some embodiments may have a COP (Cell on Peri) structure. The cell array region CA may include a plurality of first conductive lines CL1, a plurality of second conductive lines CL2, and a plurality of first memory cells MC1.

The first conductive lines CL1 and the second conductive lines CL2 may intersect each other. For example, as shown in FIG. 2, the first conductive lines CL1 may extend side by side in a first direction Y parallel to the upper surface of the substrate 100, and the second conductive lines CL2 may extend side by side in a second direction X that is parallel to the upper surface of the substrate 100 and intersects the first direction Y.

The first conductive lines CL1 and the second conductive lines CL2 may form bit lines and word lines of the variable resistance memory device according to some embodiments. In an example, the first conductive lines CL1 may function as word lines, and the second conductive lines CL2 may function as bit lines. As another example, the first conductive lines CL1 may function as bit lines, and the second conductive lines CL2 may function as word lines.

For example, the first conductive lines CL1 and the second conductive lines CL2 may include conductive materials, e.g., tungsten (W), aluminum (Al) or copper (Cu), respectively. In some embodiments, the first conductive lines CL1 and the second conductive lines CL2 may further include conductive metal nitrides, e.g., titanium nitride (TiN) and tungsten nitride (WN), respectively.

The first memory cells MC1 may be arranged two-dimensionally at intersections of the first conductive lines CL1 and the second conductive lines CL2. For example, as shown in FIG. 2, the first memory cells MC1 may be arranged two-dimensionally (e.g., in the form of a matrix) in a plane parallel to the upper surface of the substrate 100 (e.g., a plane including the first direction Y and the second direction X). Although the first memory cells MC1 are only shown to have a square columnar shape, this is only exemplary, and the first memory cells MC1 may have any suitable shape, e.g., a rounded square columnar shape and/or a cylindrical shape, and the like.

In the following description, the cell array region CA according to some embodiments will be described more specifically referring to FIGS. 2 to 4.

The first conductive lines CL1 may be spaced apart from each other by the first trenches T1, and a first embedded insulating film 115 that fills at least a part of the first trenches T1. The first trenches T1 may be arranged, e.g., spaced apart from each other, along the second direction X and may each extend in the first direction Y. The first embedded insulating film 115 may have a bar or a line shape that fills the first trenches T1. The first embedded insulating film 115 may include, e.g., at least one of silicon oxide, silicon nitride, and silicon oxynitride.

In some embodiments, the width of each first conductive line CL1 may decrease from the lower surface to the upper surface, e.g., in a direction oriented from the substrate 100 toward the first memory cells MC1. This may be due to the features of the etching process for forming the first trenches T1.

In some embodiments, the first embedded insulating film 115 may extend to the upper part of the lower insulating film 110. For example, as illustrated in FIG. 3, the lower part of the first embedded insulating film 115 may extend into, e.g., be inserted into, the upper part of the lower insulating film 110. This may be due to the features of the etching process for forming the first trench T1.

The first memory cells MC1 may be formed on the first conductive lines CL1. Each first memory cell MC1 may include a switching pattern 120 and a variable resistance pattern 130. Although the switching pattern 120 is only shown to be interposed between the first conductive line CL1 and the variable resistance pattern 130, and the variable resistance pattern 130 is only shown to be interposed between the switching pattern 120 and the second conductive line CL2, this is just an example. As another example, the variable resistance pattern 130 may be interposed between the first conductive line CL1 and the switching pattern 120, and the switching pattern 120 may be interposed between the variable resistance pattern 130 and the second conductive line CL2.

The switching pattern 120 may have an island shape that is placed at each intersection of the first conductive lines CL1 and the second conductive lines CL2 and is physically spaced apart from other switching patterns 120 placed at the adjacent intersections. The variable resistance pattern 130 may have an island shape that is placed at each intersection of the first conductive line CL1 and the second conductive line CL2, and is physically spaced apart from the other variable resistance patterns 130 placed at the adjacent intersections. For example, the switching pattern 120 and the variable resistance pattern 130 may vertically overlap each other.

For example, one physically connected variable resistance pattern 130 may be shared among the plurality of first memory cells MC1. For example, the variable resistance pattern 130 may have a line shape extending along the first direction Y or the second direction X.

The variable resistance pattern 130 may include at least one material having physical properties that enable information storage. When the variable resistance memory device according to some embodiments is a phase change random access memory (PRAM) device, the variable resistance pattern 130 may be a phase change pattern in which the resistance, e.g., a resistance value, changes depending on the phase change. For example, the variable resistance pattern 130 may include a material in which a reversible phase change between crystalline and amorphous states occurs depending on the temperature. In an example, a phase transition temperature between crystalline and amorphous states of the variable resistance pattern 130 may be from about 250° C. to about 350° C.

The variable resistance pattern 130 may include a compound in which at least one of Te, Se and S, as a chalcogenide element, is combined with at least one of, e.g., Ge, Sb, Bi, Pb, Sn, Ag, As, Si, In, Ti, Ga, P, O and C. As an example, the variable resistance pattern 130 may include at least one of binary materials, e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb and NdSb; ternary materials, e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe and NdSbS; quaternary materials, e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe and NdGeSbS; or quinary materials, e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn and GeSbSeZnSn.

The variable resistance pattern 130 may be formed of a single layer including one of the aforementioned materials, or may be formed of a plurality of layers, each including different ones from each other among the aforementioned materials. In some embodiments, the variable resistance pattern 130 may have a superlattice structure in which layers including Ge and layers not including Ge are repeatedly stacked. As an example, the variable resistance pattern 130 may have a structure in which a GeTe layer and a $Sb_2Te_3$ layer are repeatedly stacked, or the GeTe layer and a $Bi_2Te_3$ layer are repeatedly stacked. In some embodiments, the variable resistance pattern 130 may further include at least one of B, C, N, O, P, Cd, W, Ti, Hf, and Zr, in addition to the materials exemplified above.

The switching pattern 120 may be an ovonic threshold switching (OTS) pattern having bi-directional characteristics. In an example, the switching pattern 120 may include elements based on a threshold switching phenomenon having a non-linear (e.g., S-shaped) I-V curve. The switching pattern 120 may have a phase transition temperature between crystalline and amorphous states higher than that of the variable resistance pattern 130. In an example, the phase transition temperature of the switching pattern 120 may be from about 350° C. to about 450° C. As a result, at the time of the operation of the variable resistance memory device according to some embodiments, the variable resistance pattern 130 reversibly undergoes a phase change between crystalline and amorphous states under an operating voltage, whereas the switching pattern 120 may maintain a substantially amorphous state under the operating voltage without phase change. As used herein, the term "substantially amorphous state" does not exclude a case where crystal grain boundaries locally exist or crystallized portions locally exist in a part of the object.

The switching pattern 120 may include a compound in which at least one of Te, Se and S, as a chalcogenide element, is combined with at least one of, e.g., Ge, Sb, Bi, Al, Pb, Sn, Ag, As, Si, In, Ti, Ga and P. In an example, the switching pattern 120 may include at least one of binary materials, e.g., GeSe, GeS, AsSe, AsTe, asS SiTe, SiSe, SiS, GeAs, SiAs, SnSe and SnTe; ternary materials, e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe and SnAsTe; quaternary materials, e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn and GeAsTeZn; quinary materials, e.g., GeSiAsSeTe, GeSiAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAs- TeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn and GeAsSeZnSn; or hexary (i.e., senary) materials, e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn and GeAsSeSAlSn.

The switching pattern 120 may be formed of a single layer including one of the aforementioned materials, or may be formed of a plurality of layers, each including different ones from each other among the aforementioned materials. In some embodiments, the switching pattern 120 may further include at least one of B, C, N and O in addition to the materials exemplified above.

In some embodiments, a first electrode EL1 may be interposed between the first conductive line CL1 and the switching pattern 120, a second electrode EL2 may be interposed between the switching pattern 120 and the variable resistance pattern 130, and a third electrode EL3 may be interposed between the variable resistance pattern 130 and the second conductive line CL2. As an example, each first memory cell MC1 may include the first electrode EL1, the switching pattern 120, the second electrode EL2, the variable resistance pattern 130, and the third electrode EL3 which are sequentially stacked on the first conductive line CL1. However, this is only an example, and, e.g., the variable resistance pattern 130 may be interposed between the first electrode EL1 and the second electrode EL2, and the switching pattern 120 may be interposed between the second electrode EL2 and the third electrode EL3.

For example, the first electrode EL1, the second electrode EL2, and the third electrode EL3 may each include a conductive material, e.g., a metal. In another example, the first electrode EL1, the second electrode EL2, and the third electrode EL3 may be carbon electrodes including carbon (C).

For example, the first electrode EL1 and the third electrode EL3 may each include at least one of a metal, e.g., tungsten (W), platinum (Pt), palladium (Pd), rhodium (Rh), ruthenium (Ru), iridium (Ir), copper (Cu), aluminum (Al), titanium (Ti) and tantalum (Ta), a metal nitride, e.g., titanium nitride (TiN), and combinations thereof. For example, the second electrode EL2 may include metal nitrides or silicon metal nitrides, e.g., titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), and zirconium silicon nitride (ZrSiN).

In some embodiments, a first insertion film 142 may be interposed between the second electrode EL2 and the variable resistance pattern 130, and a second insertion film 144 may be interposed between the variable resistance pattern 130 and the third electrode EL3. For example, the first memory cell MC1 may include the first electrode EL1, the switching pattern 120, the second electrode EL2, the first insertion film 142, the variable resistance pattern 130, the second insertion film 144, and the third electrode EL3 that are sequentially stacked on the first conductive line CL1.

The first insertion film 142 may cover the lower surface of the variable resistance pattern 130, and the second insertion film 144 may cover the upper surface of the variable resistance pattern 130. Therefore, the first insertion film 142 and the second insertion film 144 may prevent diffusion of the elements included inside the variable resistance pattern 130. Further, the first insertion film 142 may be interposed between the switching pattern 120 and the variable resistance pattern 130 to improve the contact resistance. The first insertion film 142 and the second insertion film 144 may, e.g., independently, include, e.g., at least one of W, Ti, Al, Cu, C, CN, TiN, TiAlN, TiSiN, TiCN, WN, CoSiN, WSiN, TaN, TaCN and TaSiN, respectively.

In some embodiments, the side surfaces of the variable resistance pattern 130 may include a recess. The recess may be a region in which the side surface of the variable resistance pattern 130 is recessed on the basis of the side surface of the first insertion film 142 and the side surface of the second insertion film 144.

In some embodiments, each first memory cell MC1 may include a spacer structure 150. The spacer structure 150 may cover side surfaces of each of the first insertion film 142, the second insertion film 144, the variable resistance pattern 130, and the third electrode EL3. The lower surface of the spacer structure 150 may be in contact with the upper surface of the second electrode EL2. The spacer structure 150 may include, e.g., at least one of a silicon oxide film, a silicon nitride film and a silicon oxynitride film.

In an example, the spacer structure 150 may include a first spacer 152 and a second spacer 154 that include materials different from each other. The first spacer 152 may fill the recess on the side surface of the variable resistance pattern 130. The second spacer 154 may cover the side surface of the first spacer 152. In another example, the spacer structure 150 may be formed of a single layer including one of the aforementioned materials.

The first memory cells MC1 may be arranged two-dimensionally (e.g., in a matrix) in a plane including the first direction Y and the second direction X. Further, the first memory cells MC1 may be spaced apart from each other by a second trench T2 and a second embedded insulating film 160 that fills at least a part of the second trench T2. For example, the second trench T2 or the second embedded insulating film 160 may have a lattice or mesh shape extending in a plane including the first direction Y and the second direction X. The second embedded insulating film 160 may include, e.g., at least one of silicon oxide, silicon nitride and silicon oxynitride.

In some embodiments, the second embedded insulating film 160 may include a first capping film 162 and a first filling film 164 that are sequentially stacked inside the second trench T2. The first capping film 162 may conformally extend along the side surface of the first memory cell MC1. A lower surface of the first capping film 162 may be in contact with the upper surface of the first embedded insulating film 115 and the upper surfaces of the first conductive lines CL1 exposed between the first memory cells MC1. The first filling film 164 may be formed on the first capping film 162. The first filling film 164 may be spaced apart from the first memory cell MC1 by the first capping film 162.

The first capping film 162 may include, e.g., at least one of SiN, SiO$_2$, SiON, SiBN, SiCN, SiOCN, Al$_2$O$_3$, AN, and AlON. The first filling film 164 may include, e.g., at least one of SiN, SiON, SiC, SiCN, SiOC, SiOCN, SiO$_2$, and Al$_2$O$_3$.

In some embodiments, the portions of the second embedded insulating film 160 on the first embedded insulating film 115 may extend below the upper surfaces of the first conductive lines CL1. For example, the lower part of the second embedded insulating film 160 may be inserted into the upper part of the first embedded insulating film 115. This may be due to the features of the etching process for forming the second trench T2.

The second conductive lines CL2 may be formed on the first memory cells MC1 and the second embedded insulating film 160. The second conductive lines CL2 may be spaced apart from each other by third trenches T3 and a third embedded insulating film 180 that fills at least a part of the third trenches T3. The third trenches T3 are arranged along the first direction Y and may each extend in the second direction X. The third embedded insulating film 180 may have a bar or a line shape that fills the third trenches T3. The third embedded insulating film 180 may include, e.g., at least one of silicon oxide, silicon nitride and silicon oxynitride.

In some embodiments, each second conductive line CL2 may include a first barrier pattern 172 and a first metal pattern 174 that are sequentially stacked on the first memory cells MC1. For example, the first barrier pattern 172 may include metal nitrides, e.g., TiN, WN, or TaN. For example, the first metal pattern 174 may include a metal material, e.g., W, Ti, or Ta. A thickness of the first barrier pattern 172 (e.g., in the vertical direction) may be, e.g., about 1/20 to 1/7 of a thickness of the first metal pattern 174. In some other embodiments, each second conductive line CL2 may not include a first barrier pattern 172.

In some embodiments, the first mask pattern 176 may remain on the second conductive line CL2. In some other embodiments, the first mask pattern 176 may not remain. For example, when another memory cell stack (e.g., the second memory cells MC2 of FIGS. 7 to 9) is stacked on the second conductive line CL2, the first mask pattern 176 may not remain.

In some embodiments, the width of each second conductive line CL2 and/or the width of the first mask pattern 176 may decrease from the lower surface to the upper surface. This may be due to the features of the etching process for forming the third trenches T3.

In some embodiments, the third embedded insulating film 180 may include a second capping film 182 and a second filling film 184 that are sequentially stacked inside the third trench T3. The second capping film 182 may conformally extend along the side surfaces of the second conductive line CL2 and/or the side surfaces of the first mask pattern 176. The lower surface of the second capping film 182 may be in contact with the upper surface of the second embedded insulating film 160 exposed between the second conductive lines CL2. The second capping film 182 may not be in contact with the upper surfaces of the first memory cells MC1 (e.g., may not be in contact with the upper surface of the third electrode EL3). The second filling film 184 may be formed on the second capping film 182. The second filling film 184 may be spaced apart from the second conductive line CL2 by the second capping film 182.

The second capping film 182 may include, e.g., at least one of SiN, SiO$_2$, SiON, SiBN, SiCN, SiOCN, Al$_2$O$_3$, AlN, and AlON. The second filling film 184 may include, e.g., at least one of SiN, SiON, SiC, SiCN, SiOC, SiOCN, SiO$_2$, and Al$_2$O$_3$.

Referring again to FIG. 1, the first memory cells MC1 of the cell array region CA may be electrically connected to the peripheral circuit region PERI. For example, the first memory cells MC1 of the cell array region CA may be electrically connected to the peripheral circuit region PERI via first and second via contacts VC1 and VC2.

For example, the first via contact VC1 that connects the lower wiring structure 111 and the first conductive line CL1 may be formed. The first via contact VC1 may extend in the third direction Z to electrically connect the lower wiring structure 111 and the first conductive line CL1. In some embodiments, the first via contact VC1 may connect the wiring pattern located at the uppermost part among the lower wiring patterns 112 to the first conductive line CL1.

For example, the second via contact VC2 that connects the lower wiring structure 111 and the second conductive line CL2 may be formed. The second via contact VC2 may extend in the third direction Z to electrically connect the lower wiring structure 111 and the second conductive line CL2. In some embodiments, the second via contact VC2 may connect the wiring pattern located at the uppermost part among the lower wiring patterns 112 to the second conductive line CL2.

In some embodiments, the width of the first via contact VC1 and the width of the second via contact VC2 may decrease from the upper surface to the lower surface, respectively. This may be due to the features of the etching process for forming the first via contact VC1 and the second via contact VC2.

The protective film 500 may be stacked on the cell array region CA. For example, a first interlayer insulating film 190 that covers the cell array region CA may be formed on the peripheral circuit region PERI. The protective film 500 may conformally extend along, e.g., an entirety of, the upper surface of the first interlayer insulating film 190. Further, the protective film 500 may cover, e.g., vertically overlap, the upper surface of the cell array region CA. That is, the protective film 500 may overlap the cell array region CA in a vertical direction (e.g., the third direction Z) intersecting the upper surface of the substrate 100. In some embodiments, the protective film 500 may cover the entire upper surface of the cell array region CA.

The protective film 500 may include a material that protects the cell array region CA from various physical/chemical materials that are used in the process of forming the wiring region BEOL to be described later or damages that occur incidentally. In some embodiments, the protective film 500 may include at least one of aluminum oxide (AlO), silicon nitride (SiN), and combinations thereof. In this case, the protective film 500 may effectively protect the cell array region CA from materials or damage (e.g., hydrogen permeation or the like) caused by the process of forming the wiring region BEOL. The protective film 500 may be formed of a single layer including one of the above materials, or may be formed of a plurality of layers each including different ones among the above materials.

The protective film 500 may be vapor-deposited by various methods, e.g., a chemical vapor deposition (CVD)

method, an atomic layer deposition (ALD) method, and/or a sputtering deposition method. A thickness of the protective film 500 (e.g., TH1 of FIG. 5) may be, e.g., from about 100 angstroms to about 700 angstroms. Within the above range, the protective film 500 may effectively protect the cell array region CA from materials and damage caused by the process of forming the wiring region BEOL.

Referring to FIG. 4, in the variable resistance memory device according to some embodiments, the cell array region CA may include a first cell array A1 and a second cell array A2. The first cell array A1 and the second cell array A2 may include the first memory cells MC1 arranged two-dimensionally (e.g., in the form of a matrix) in a plane including the first direction Y and the second direction X, respectively.

The first cell array A1 and the second cell array A2 may be arranged, e.g., adjacent to each other, along the second direction X. The first cell array A1 and the second cell array A2 may share the second conductive lines CL2 extending in the second direction X. For example, each second conductive line CL2 may be connected to at least a part of the first memory cells MC1 of the first cell array A1 and at least a part of the first memory cells MC1 of the second cell array A2.

In some embodiments, the first via contact VC1 may extend in the third direction Z and be connected to the lower surfaces of each first conductive line CL1, and the second via contact VC2 may extend in the third direction Z and be connected to the lower surfaces of each second conductive line CL2. As a result, the first via contacts VC1 and the second via contacts VC2 may not penetrate the protective film 500 and may be electrically connected to the peripheral circuit element PC.

In some embodiments, the second via contacts VC2 may be interposed between the first cell array A1 and the second cell array A2. For example, a first separation region S1 in which the first memory cells MC1 are not formed may be formed between the first cell array A1 and the second cell array A2. The second via contacts VC2 may extend in the third direction Z inside the first separation region S1 and be connected to each second conductive line CL2.

Referring to FIG. 1 again, the wiring region BEOL may be stacked on the protective film 500. That is, the protective film 500 may be interposed between the cell array region CA and the wiring region BEOL, e.g., the protective film 500 may completely separate between the cell array region CA and the wiring region BEOL. For example, a second interlayer insulating film 510 that covers the protective film 500 may be formed on the protective film 500. The wiring region BEOL may be stacked on the second interlayer insulating film 510. The wiring region BEOL may include an inter-wiring insulating film 610 and an upper wiring structure 620.

The inter-wiring insulating film 610 may be formed on the second interlayer insulating film 510. The upper wiring structure 620 may have a multilayer structure formed inside the inter-wiring insulating film 610. For example, the upper wiring structure 620 may include upper wiring patterns 622 and 626 of the multilayer structure, and upper via patterns 624 that interconnect the upper wiring patterns 622 and 626.

As an example, the inter-wiring insulating film 610 may include a first etching blocking film 612, a first insulating film 614, a second etching blocking film 616, and a second insulating film 618 that are sequentially stacked on the second interlayer insulating film 510. The upper wiring patterns 622 and 626 may include a first wiring pattern 622, a via pattern 624, and a second wiring pattern 626 that are sequentially stacked on the second interlayer insulating film 510. The first wiring pattern 622 may be formed inside the first etching blocking film 612 and the first insulating film 614. The second wiring pattern 626 may be formed inside the second insulating film 618. The via pattern 624 may penetrate the second etching blocking film 616 to connect the first wiring pattern 622 and the second wiring pattern 626. The placement, number of layers, and the like of the upper wiring patterns 622 and 626 and the upper via pattern 624 are merely exemplary and are not limited to those shown.

In some embodiments, the upper wiring structure 620 may include a conductive film, and a barrier film for preventing the diffusion of elements included in the conductive film. For example, the conductive film may include metal materials, e.g., tungsten (W), aluminum (Al) and/or copper (Cu). For example, the barrier film may include metal or metal nitrides, e.g., titanium (Ti), titanium nitride (TiN), tantalum (Ta) or tantalum nitride (TaN).

The wiring region BEOL may be electrically connected to the peripheral circuit region PERI. For example, a through via TV that connects the lower wiring structure 111 and the upper wiring structure 620 may be formed. The through via TV may extend in the third direction Z and may electrically connect the lower wiring structure 111 and the upper wiring structure 620. In some embodiments, the through via TV may connect a wiring pattern located at the uppermost part among the lower wiring patterns 112 to a wiring pattern located at the lowermost part among the upper wiring patterns 622 and 626.

In some embodiments, the width of the through via TV may decrease from the upper surface to the lower surface. This may be due to the features of the etching process for forming through via TV.

Referring to FIGS. 1, 5 and 6, in the variable resistance memory device according to some embodiments, the through via TV may penetrate the protective film 500. For example, as illustrated in FIG. 1, the through via TV may extend continuously from the lower wiring structure 111 to the upper wiring structure 620 through the protective film 500.

For example, the protective film 500 may form not only an overlapping region that overlaps the cell array region CA, but may also form a non-overlapping region that does not overlap the cell array region CA. For example, as illustrated in FIG. 1, the protective film 500 may form a non-overlapping region of the cell array region CA that is peripheral to the cell array region CA. For example, the through via TV may penetrate the protective film 500 at the non-overlapping region, e.g., in a region peripheral to the cell array region CA, and may connect the lower wiring structure 111 and the upper wiring structure 620.

In some embodiments, the side surface of the protective film 500 adjacent to, e.g., facing, the through via TV may include a concave recess 500R. The recess 500R may be formed by recessing the side surface of the protective film 500 in the etching process for forming the through via TV.

In some embodiments, a part of the through via TV may protrude towards the side surfaces of the protective film 500. For example, the through via TV may include a pillar portion TVa extending in the third direction Z, and a protruding portion TVb protruding from the side surface of the pillar portion TVa toward the side surface of the protective film 500.

In some embodiments, as shown in FIG. 5, the protruding portion TVb of the through via TV may fill at least a part of the recess 500R of the protective film 500. For example, the protruding portion TVb of the through via TV may completely fill the recess 500R of the protective film 500, and may be in direct contact with the side surface of the protective film 500.

In some embodiments, as shown in FIG. 6, a void 500G may be formed between the through via TV and the protective film 500. The void 500G may be formed in the region of the recess 500R that remains unfilled, after the protruding portion TVb of the through via TV is filled. The void 500G may be, e.g., an air gap.

In the fabrication of the semiconductor device, in a post-process step for forming a wiring region (e.g., Back End of Line (BEOL) step forming the wiring region BEOL described above), various processes, e.g., a conductive material forming process, a patterning process, a cleaning process, an insulating material forming process, and an annealing process may be performed. However, various physical/chemical materials that are used in the process procedure or damages that occur incidentally may adversely affect the reliability of the cells formed beneath them.

In particular, the variable resistance memory devices having variable resistance characteristics are vulnerable to the above-mentioned physical/chemical materials or damages, and meticulous care is required. For example, in the case of a phase change memory (PRAM) device having a variable resistance characteristic due to a phase change, hydrogen permeation that occurs in a post-process step may cause deterioration of the reliability of the memory cell formed below the phase change memory device.

However, the variable resistance memory device according to some embodiments may protect the cell array region CA from various physical/chemical materials or damages generated in the post-process step by including the protective film 500. Specifically, as described above, the protective film 500 may be interposed between the cell array region CA and the wiring region BEOL and cover the upper surface of the cell array region CA. A variable resistance memory device having improved reliability can be provided accordingly.

Figure 7:
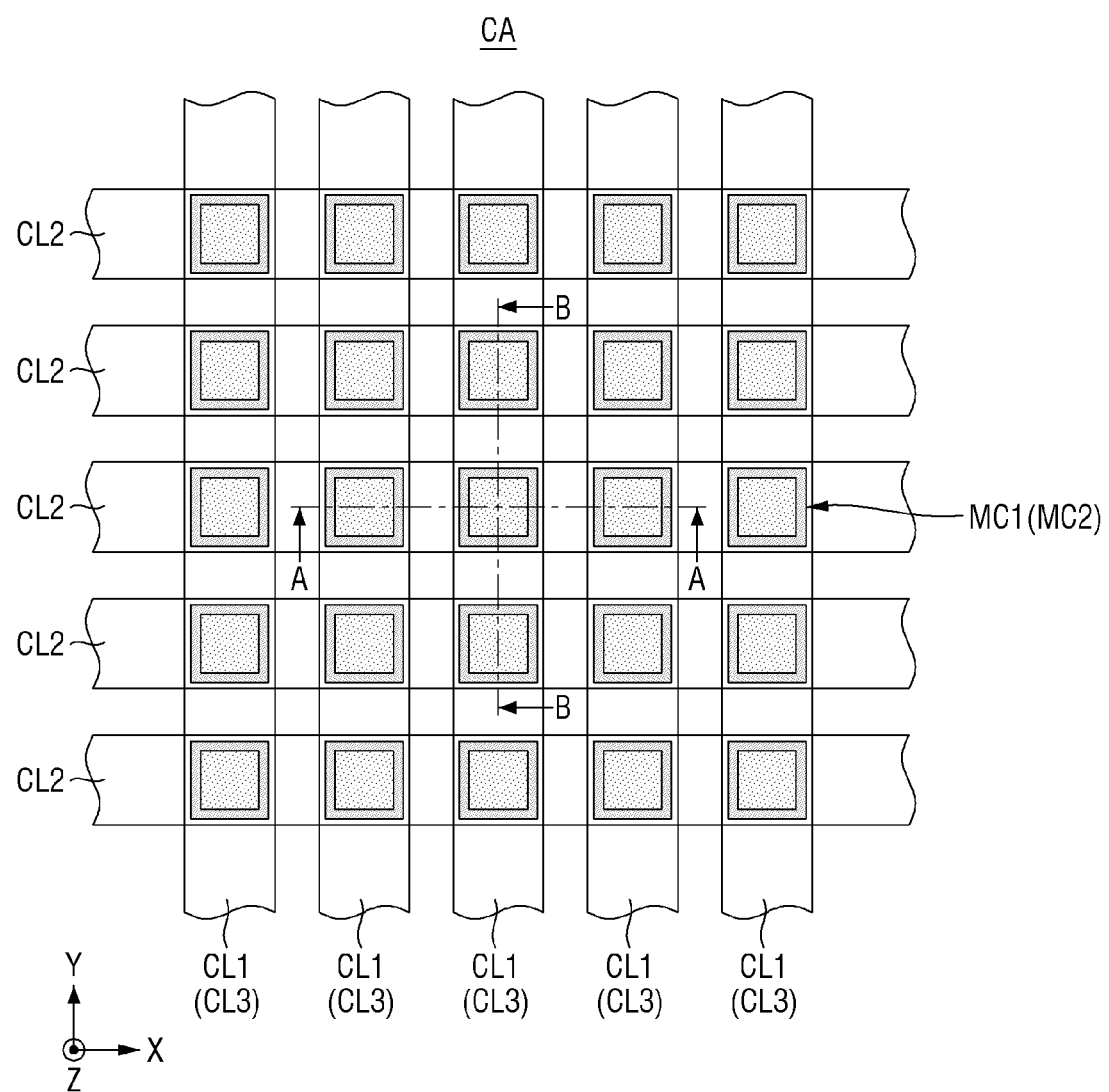
FIG. 7 is another layout diagram of the cell array region of FIG. 1.
Figure 8:
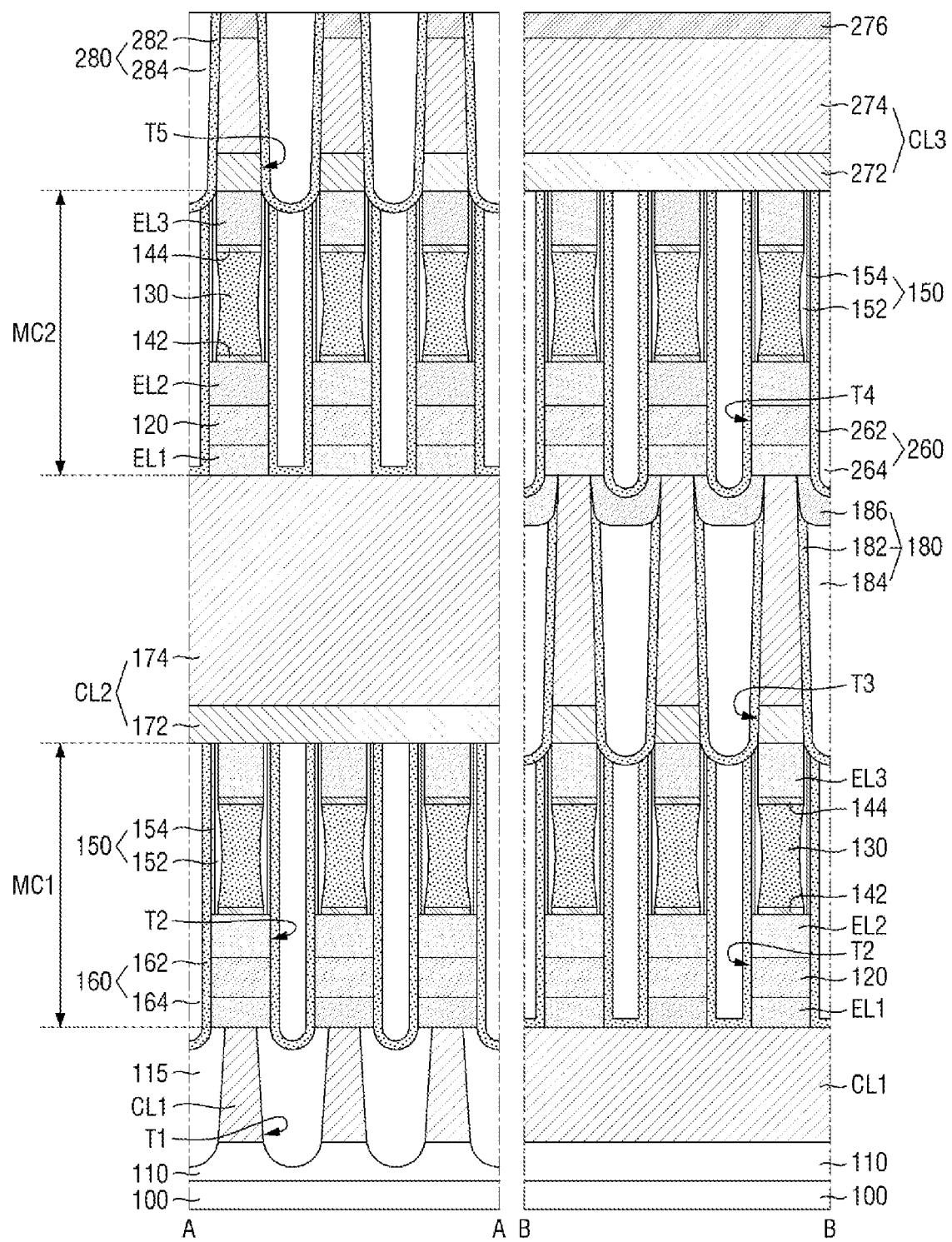
FIG. 8 is a cross-sectional view taken along lines A-A and B-B of FIG. 7.
Figure 9:
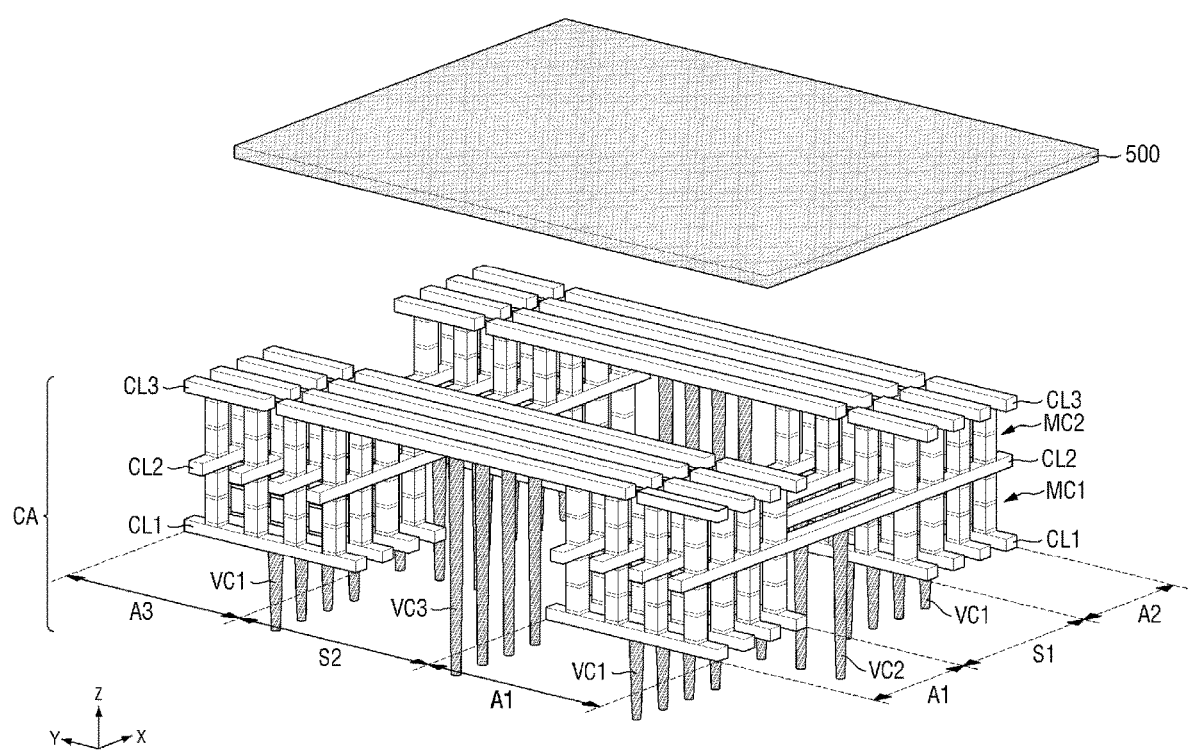
FIG. 9 is a conceptual diagram of the cell array region of FIGS. 7 and 8.

FIG. 7 is another exemplary layout diagram for explaining the cell array region of FIG. 1. FIG. 8 is a cross-sectional view taken along the lines A-A and B-B of FIG. 7. FIG. 9 is a conceptual diagram for explaining the cell array region of FIGS. 7 and 8. For convenience of explanation, repeated parts of contents explained above using FIGS. 1 to 6 will be only briefly described or omitted.

Referring to FIGS. 7 to 9, in a variable resistance memory device according to some embodiments, the cell array region CA may further include a plurality of third conductive lines CL3 and a plurality of second memory cells MC2. The third conductive lines CL3 may intersect the second conductive lines CL2, e.g., the third conductive lines CL3 may extend in a same direction as and overlap the first conductive lines CL1.

For example, the third conductive lines CL3 may extend side by side in the first direction Y. The third conductive lines CL3 may form bit lines or word lines of the variable resistance memory device according to some embodiments. As an example, the first conductive lines CL1 and the third conductive lines CL3 may function as word lines, and the second conductive lines CL2 may function as bit lines. As another example, the first conductive lines CL1 and the third conductive lines CL3 may function as bit lines, and the second conductive lines CL2 may function as word lines.

For example, the third conductive lines CL3 may each include a conductive material, e.g., tungsten (W), aluminum (Al) and/or copper (Cu). In some embodiments, the third conductive lines CL3 may each further include a conductive metal nitride, e.g., titanium nitride (TiN) and/or tungsten nitride (WN).

The second memory cells MC2 may be formed on the second conductive lines CL2. The second memory cells MC2 may be placed two-dimensionally at the intersection of the second conductive lines CL2 and the third conductive lines CL3. The second memory cells MC2 may be similar to the first memory cells MC1 except that they may be placed at the intersection of the second conductive lines CL2 and the third conductive lines CL3. For example, each second memory cell MC2 may include the switching pattern 120 and the variable resistance pattern 130. Therefore, detailed description of the second memory cell MC2 will be omitted.

The second memory cells MC2 may be spaced apart from each other by a fourth trench T4 and a fourth embedded insulating film 260 that fills at least a part of the fourth trench T4. For example, the fourth trench T4 or the fourth embedded insulating film 260 may have a lattice or mesh shape extending in a plane including the first direction Y and the second direction X. The fourth embedded insulating film 260 may include, e.g., at least one of silicon oxide, silicon nitride, and silicon oxynitride.

In some embodiments, the fourth embedded insulating film 260 may include a third capping film 262 and a third filling film 264 that are sequentially stacked inside the fourth trench T4. The third capping film 262 may conformally extend along the side surface of the second memory cell MC2. A lower surface of the third capping film 262 may be in contact with the upper surface of the third embedded insulating film 180 and the upper surface of the second conductive lines CL2 exposed between the second memory cells MC2. The third filling film 264 may be formed on the third capping film 262. The third filling film 264 may be spaced apart from the second memory cell MC2 by the third capping film 262.

The third capping film 262 may include, e.g., at least one of SiN, $SiO_2$, SiON, SiBN, SiCN, SiOCN, $Al_2O_3$, AlN, and AlON. The third filling film 264 may include, e.g., at least one of SiN, SiON, SiC, SiCN, SiOC, SiOCN, $SiO_2$, and $Al_2O_3$.

In some embodiments, the third embedded insulating film 180 may further include a support pattern 186. The second capping film 182 and the second filling film 184 may fill the lower part of the third trench T3, and the support pattern 186 may fill the upper surface of the third trench T3. From a cross-sectional view, the second filling film 184 may be surrounded by the second capping film 182 and the support pattern 186. The support pattern 186 may extend in the second direction X between the second conductive lines CL2. The support pattern 186 may have a shape that is convex downwardly (e.g., toward the substrate 100). The support pattern 186 may be thicker than the thickness of the second capping film 182. The support pattern 186 may include, e.g., at least one of SiN, $SiO_2$, SiON, SiBN, SiCN, SiOCN, $Al_2O_3$, AlN, and AlON.

In some embodiments, the second capping film 182, the second filling film 184, and the support pattern 186 may include different materials from each other. For example, the second filling film 184 may have a higher carbon concentration than the support pattern 186. The support pattern 186 may have a higher dielectric constant than that of the second filling film 184. As an example, the second filling film 184 may include SiOC, and the support pattern 186 may include at least one of $SiO_2$, SiN and SiON.

In some embodiments, the portions of the fourth embedded insulating film 260 on the third embedded insulating film 180 may extend below the upper surface of the second conductive line CL2. For example, the lower part of the fourth embedded insulating film 260 may be inserted into the upper part of the third embedded insulating film 180 (e.g., the upper part of the support pattern 186). This may be due to the features of the etching process for forming the fourth trench T4.

The third conductive lines CL3 may be formed on the second memory cells MC2 and the fourth embedded insulating film 260. The third conductive lines CL3 may be spaced apart from each other by fifth trenches T5 and a fifth embedded insulating film 280 that fills at least a part of the fifth trenches T5. The fifth trenches T5 may be arranged along the second direction X and may each extend in the first direction Y. The fifth embedded insulating film 280 may have a bar or line shape that fills the fifth trenches T5. The fifth embedded insulating film 280 may include, e.g., at least one of silicon oxide, silicon nitride, and silicon oxynitride.

In some embodiments, each third conductive line CL3 may include a second barrier pattern 272 and a second metal pattern 274 that are sequentially stacked on the second memory cells MC2. For example, the second barrier pattern 272 may include metal nitrides, e.g., TiN, WN, and/or TaN. For example, the second metal pattern 274 may include a metal material, e.g., W, Ti and/or Ta. The thickness of the second barrier pattern 272 may be, e.g., about 1/20 to 1/7 of the thickness of the second metal pattern 274. In some other embodiments, each third conductive line CL3 may not include the second barrier pattern 272.

In some embodiments, the thickness of each of the second conductive lines CL2 may be greater than the thickness of each of the first conductive lines CL1 and the thickness of the third conductive lines CL3. For example, the thickness of the first conductive lines CL1 and the thickness of the third conductive lines CL3 may be equal to or less than half the thickness of the second conductive lines CL2.

In some embodiments, the second mask pattern 276 may remain on the third conductive line CL3. In some other embodiments, the second mask pattern 276 may not remain. For example, when another memory cell stack is stacked on the third conductive line CL3, the second mask pattern 276 may not remain.

In some embodiments, the width of each third conductive line CL3 and/or the width of the second mask pattern 276 may decrease from the lower surface to the upper surface. This may be due to the features of the etching process for forming the fifth trenches T5.

In some embodiments, the fifth embedded insulating film 280 may include a fourth capping film 282 and a fourth filling film 284 that are sequentially stacked inside the fifth trench T5. The fourth capping film 282 may conformally extend along the side surfaces of the third conductive line CL3 and/or the side surfaces of the second mask pattern 276. The lower surface of the fourth capping film 282 may be in contact with the upper surface of the fourth embedded insulating film 260 exposed between the third conductive lines CL3. The fourth capping film 282 may not be in contact with the upper surfaces of the second memory cells MC2 (e.g., with the upper surface of the third electrode EL3). The fourth filling film 284 may be formed on the fourth capping film 282. The fourth filling film 284 may be spaced apart from the third conductive line CL3 by the fourth capping film 282.

The fourth capping film 282 may include, e.g., at least one of SiN, $SiO_2$, SiON, SiBN, SiCN, SiOCN, $Al_2O_3$, AlN, and AlON. The fourth filling film 284 may include, e.g., at least one of SiN, SiON, SiC, SiCN, SiOC, SiOCN, $SiO_2$, and $Al_2O_3$.

Referring to FIG. 9, in a variable resistance memory device according to some embodiments, the cell array region CA may further include a third cell array A3. The first cell array A1 and the third cell array A3 may be arranged, e.g., adjacent to each other, along the first direction Y. The first cell array A1 and the third cell array A3 may share the third conductive lines CL3 extending in the first direction Y. For example, each third conductive line CL3 may be connected to at least a part of the second memory cells MC2 of the first cell array A1 and at least a part of the second memory cells MC2 of the third cell array A3.

In some embodiments, the second memory cells MC2 of the cell array region CA may be electrically connected to the peripheral circuit region (PERI of FIG. 1). For example, a third via contact VC3 that connects the lower wiring structure (111 of FIG. 1) and the third conductive line CL3 may be formed. The third via contact VC3 may extend in the third direction Z to electrically connect the lower wiring structure 111 and the third conductive line CL3. In some embodiments, the third via contact VC3 may connect the wiring pattern located at the uppermost part among the lower wiring patterns (112 of FIG. 1) to the third conductive line CL3.

In some embodiments, the third via contact VC3 may extend in the third direction Z and may be connected to the lower surface of each third conductive line CL3. As a result, the third via contacts VC3 may not penetrate the protective film 500 and may be electrically connected to the peripheral circuit element PC.

In some embodiments, the third via contacts VC3 may be interposed between the first cell array A1 and the third cell array A3. For example, a second separation region S2 in which the first memory cells MC1 and the second memory cells MC2 are not formed may be formed between the first cell array A1 and the third cell array A3. The third via contacts VC3 may extend in the third direction Z inside the second separation region S2 and may be connected to each third conductive line CL3.

Figure 10:
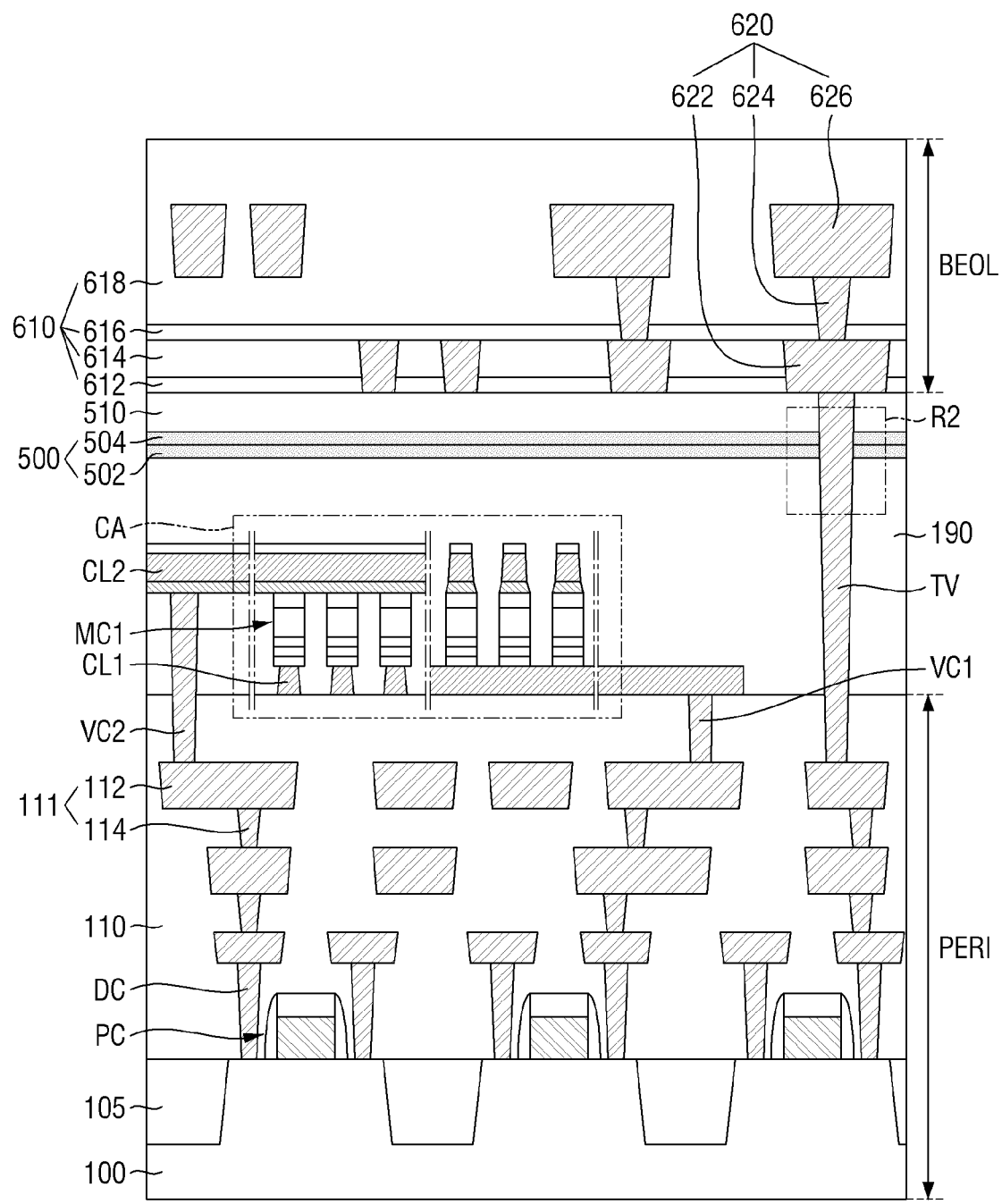
FIG. 10 is another schematic cross-sectional view of a variable resistance memory device according to some embodiments.
Figure 11:
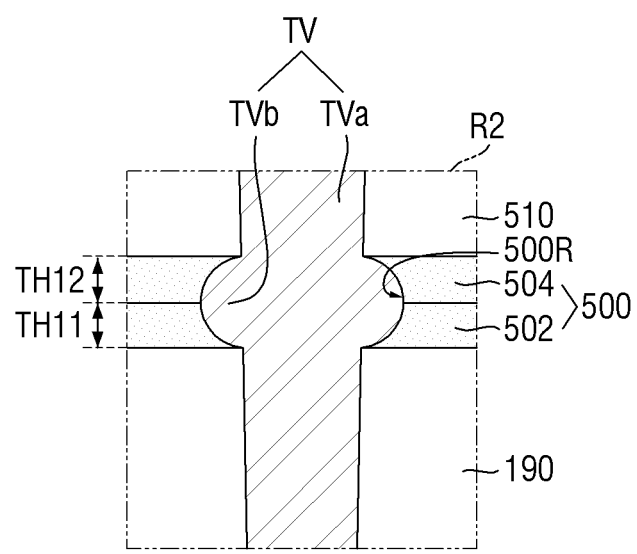
FIG. 11 is an enlarged view of region R2 of FIG. 10.

FIG. 10 is another schematic cross-sectional view for explaining a variable resistance memory device according to some embodiments. FIG. 11 is an enlarged view for explaining region R2 of FIG. 10. For convenience of explanation, repeated parts of contents explained above using FIGS. 1 to 9 will be only briefly described or omitted.

Referring to FIGS. 10 and 11, in a variable resistance memory device according to some embodiments, the protective film 500 is formed of a plurality of layers. As an example, the protective film 500 may include a first sub-protective film 502 and a second sub-protective film 504 that are sequentially stacked on the cell array region CA.

The first sub-protective film 502 and the second sub-protective film 504 may each include materials that protect the cell array region CA from various physical/chemical materials that are used in the process of forming the wiring region BEOL or damages that occur incidentally. For example, the first sub-protective film 502 and the second sub-protective film 504 may independently include at least one of aluminum oxide (AlO), silicon nitride (SiN), and a combination thereof.

In some embodiments, the first sub-protective film 502 and the second sub-protective film 504 may include different materials from each other. As an example, the first sub-protective film 502 may include a silicon nitride film, and the second sub-protective film 504 may include an aluminum oxide film. As another example, the first sub-protective film 502 may include an aluminum oxide film, and the second sub-protective film 504 may include a silicon nitride film.

The first sub-protective film 502 and the second sub-protective film 504 may be vapor-deposited by various methods, e.g., a chemical vapor deposition (CVD) method, an atomic layer deposition (ALD) method, and a sputtering deposition method, respectively. A thickness of the first sub-protective film 502 (e.g., TH11 of FIG. 11) may be, e.g., about 100 angstroms to about 700 angstroms. A thickness of the second sub-protective film 504 (e.g., TH12 of FIG. 11) may be, e.g., from about 100 angstroms to about 700 angstroms. Within the above range, the protective film 500 may effectively protect the cell array region CA from materials or damage caused by the process of forming the wiring region BEOL.

Although FIG. 11 only shows that the thickness TH11 of the first sub-protective film 502 is the same as the thickness TH12 of the second sub-protective film 504, this is merely an example. Further, although FIG. 11 only shows that the recess 500R of the protective film 500 is smoothly formed over the first sub-protective film 502 and the second sub-protective film 504, this is merely an example. As another example, the recess 500R of the protective film 500 may be discontinuous or not smoothly connected at the boundary between the first sub-protective film 502 and the second sub-protective film 504.

Figure 12:
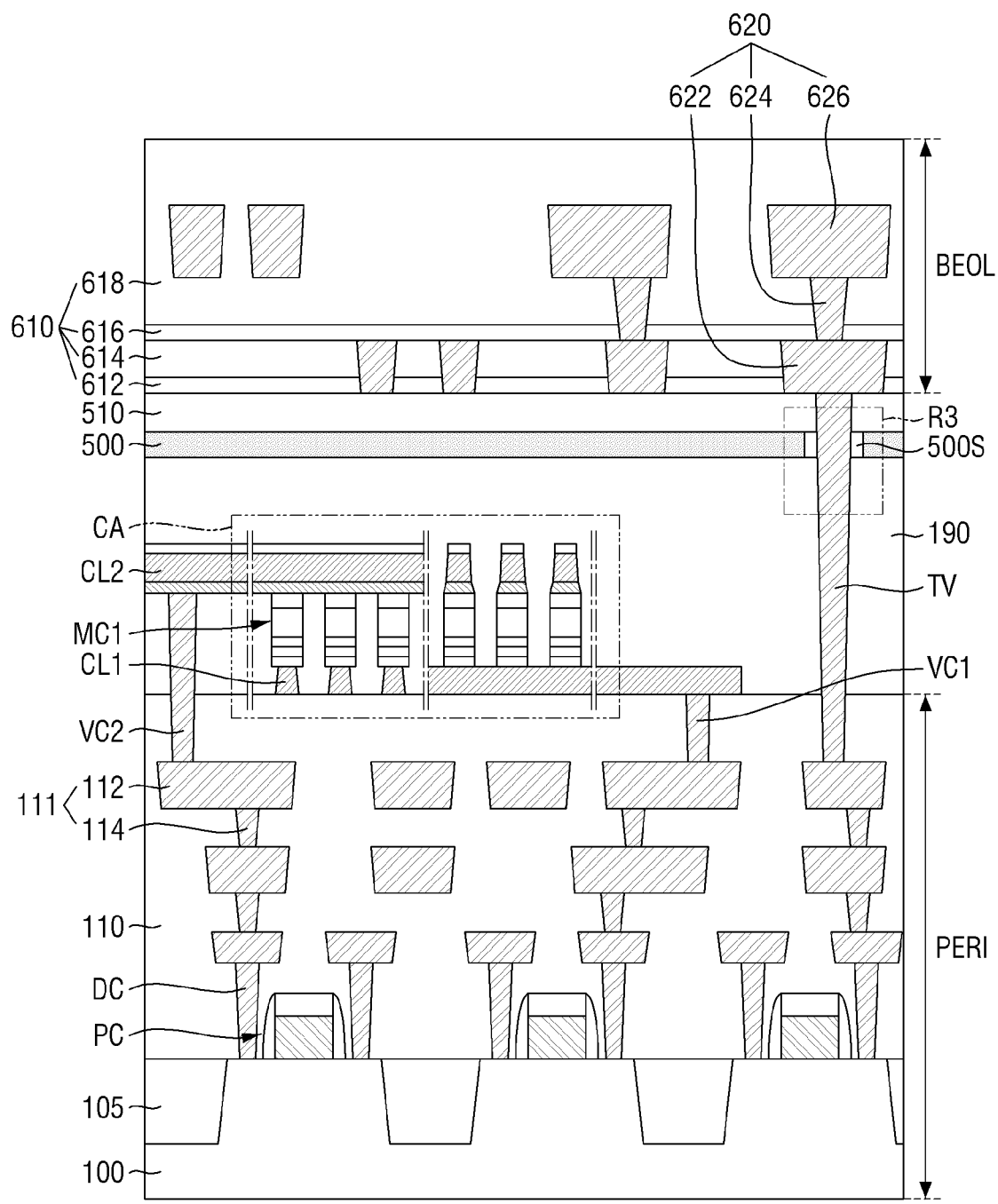
FIG. 12 is another schematic cross-sectional view of a variable resistance memory device according to some embodiments.
Figure 13:
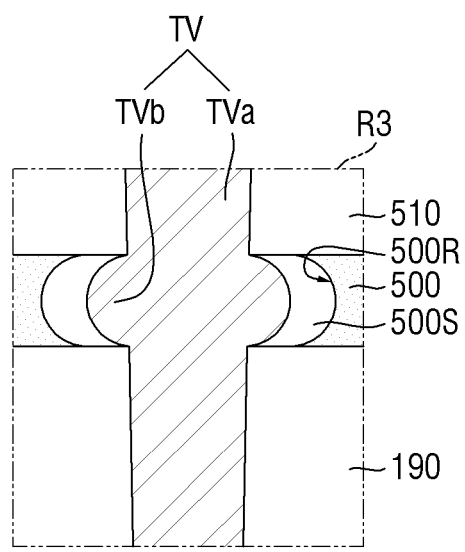
FIG. 13 is an enlarged view of region R3 of FIG. 12.

FIG. 12 is another schematic cross-sectional view for explaining the variable resistance memory device according to some embodiments. FIG. 13 is an enlarged view for explaining region R3 of FIG. 12. For convenience of explanation, repeated parts of contents explained above using FIGS. 1 to 9 will be only briefly described or omitted.

Referring to FIGS. 12 and 13, a variable resistance memory device according to some embodiments may further include a low dielectric constant film 500S. The low dielectric constant film 500S may be formed inside the protective film 500. Further, the low dielectric constant film 500S may be interposed between the protective film 500 and the through via TV. For example, the low dielectric constant film 500S may have an annular shape that, e.g., completely, surrounds the protruding portion TVb of the through via TV.

The low dielectric constant film 500S may have a dielectric constant lower than that of the protective film 500. As an example, when the protective film 500 includes an aluminum oxide film, the low dielectric constant film 500S may include a silicon oxide film. A parasitic capacitance generated by such a protective film 500 may be reduced.

Figure 14:
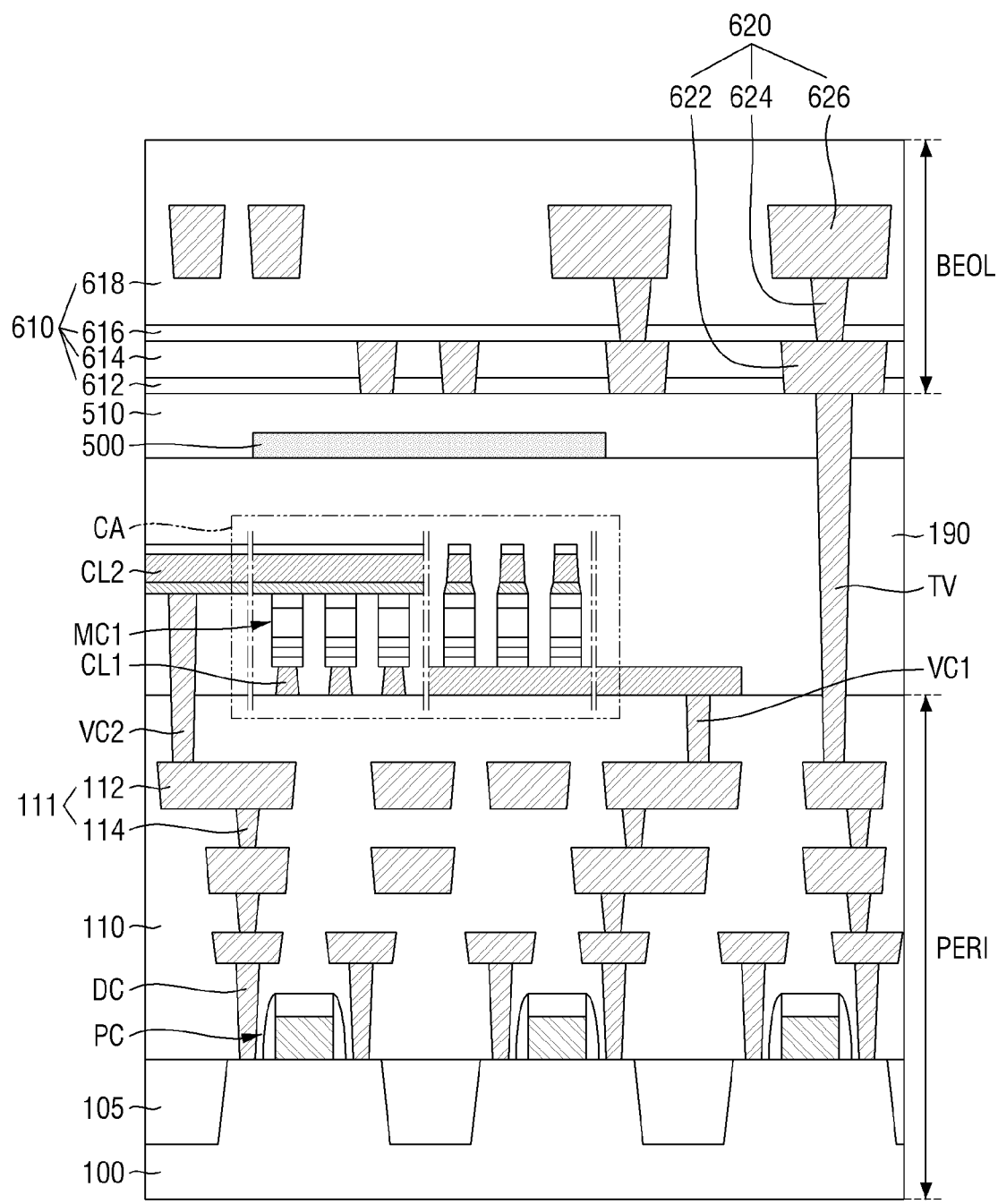
FIG. 14 is another schematic cross-sectional view of a variable resistance memory device according to some embodiments.

FIG. 14 is another schematic cross-sectional view for explaining a variable resistance memory device according to some embodiments. For convenience of explanation, repeated parts of contents explained above using FIGS. 1 to 9 will be only briefly described or omitted.

Referring to FIG. 14, in a variable resistance memory device according to some embodiments, the through via TV does not penetrate the protective film 500. For example, the protective film 500 may be formed, e.g., only, in an overlapping region that overlaps the cell array region CA, and may not be formed in a non-overlapping region that does not overlap the cell array region CA. At this time, the through via TV may be placed in the non-superimposed region and connect the lower wiring structure 111 and the upper wiring structure 620. In some embodiments, the protective film 500 may cover the entire upper surface of the cell array region CA of the overlapping region.

By way of summation and review, aspects of embodiments provide a variable resistance memory device having improved reliability. That is, according to embodiments, a variable resistance memory device includes an encapsulation layer, i.e., the protective film 500, between the cell array region CA and the wiring region BEOL to prevent impurity penetration between the cell array region CA and the wiring region BEOL, i.e., between the PRAM cell array and the wiring region BEOL thereon. For example, the encapsulation layer is formed under the wiring region BEOL with AlO, SiN, or AlO/SiN composite film to cover the entire PRAM cell array, and the wiring through which the cell array region CA is connected to the peripheral circuit region PERI can be connected only through the lower part of the cell so that a via contact for wiring does not pass through the encapsulation layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a substrate;
a cell array region on the substrate, the cell array region including:
memory cells, each of the memory cells including a switching pattern and a variable resistance pattern,
first conductive lines extending in a first direction,
second conductive lines extending in a second direction intersecting the first direction, the memory cells being at intersections of the first conductive lines and the second conductive lines, and
through vias extending through the cell array region without contacting the first conductive lines and without contacting the second conductive lines;
a peripheral circuit region on the substrate between the cell array region and the substrate, the peripheral circuit region including a lower wiring structure;
a wiring region on the cell array region with the cell array region between the wiring region and the peripheral circuit region, the wiring region including an inter-wiring insulating film and an upper wiring structure in the inter-wiring insulating film; and
a protective film between the cell array region and the wiring region, the protective film covering an upper surface of the cell array region,
wherein the first conductive lines and the second conductive lines are electrically connected to the lower wiring structure, the through vias are electrically connected to the lower wiring structure, and the upper wiring structure is electrically connected to the through vias.

2. The variable resistance memory device as claimed in claim 1, wherein the switching pattern in each of the memory cells is an ovonic threshold switching (OTS) pattern, and the variable resistance pattern in each of the memory cells is a phase change pattern in which a resistance value changes depending on a phase change.

3. The variable resistance memory device as claimed in claim 1, wherein each of the memory cells further includes:
a first electrode between the first conductive lines and the switching pattern;
a second electrode between the switching pattern and the variable resistance pattern; and
a third electrode between the variable resistance pattern and the second conductive lines.

4. The variable resistance memory device as claimed in claim 1, wherein the protective film covers an entirety of the upper surface of the cell array region.

5. The variable resistance memory device as claimed in claim 1, wherein the protective film includes at least one of aluminum oxide, silicon nitride, and a combination thereof.

6. The variable resistance memory device as claimed in claim 5, wherein:
the protective film includes a first sub-protective film and a second sub-protective film which are sequentially stacked on the cell array region, and
each of the first sub-protective film and the second sub-protective film independently includes at least one of aluminum oxide, silicon nitride, and a combination thereof.

7. The variable resistance memory device as claimed in claim 1, wherein the peripheral circuit region including a peripheral circuit element and the lower wiring structure is connected to the peripheral circuit element.

8. A variable resistance memory device, comprising:
a substrate;
a cell array region on the substrate, the cell array region including memory cells, and each of the memory cells including a switching pattern and a variable resistance pattern;
a wiring region on the cell array region, the wiring region including an inter-wiring insulating film and an upper wiring structure in the inter-wiring insulating film;
a protective film between the cell array region and the wiring region, the protective film covering an upper surface of the cell array region, and the protective film including at least one of aluminum oxide, silicon nitride, and a combination thereof;
a through via penetrating the protective film and electrically connected to the upper wiring structure; and
a low dielectric constant film between the protective film and the through via, the low dielectric constant film having a dielectric constant lower than that of the protective film.

9. The variable resistance memory device as claimed in claim 8, wherein the switching pattern is an ovonic threshold switching (OTS) pattern, and the variable resistance pattern is a phase change pattern in which a resistance value changes depending on a phase change.

10. The variable resistance memory device as claimed in claim 8, wherein:
the cell array region includes first conductive lines extending in a first direction, and second conductive lines extending in a second direction intersecting the first direction, and
the memory cells are at an intersections of the first conductive lines and the second conductive lines.

11. The variable resistance memory device as claimed in claim 8, further comprising a peripheral circuit region between the substrate and the cell array region, the peripheral circuit region including a peripheral circuit element and a lower wiring structure connected to the peripheral circuit element.

12. The variable resistance memory device as claimed in claim 11, wherein the through via electrically connects the lower wiring structure and the upper wiring structure.

13. The variable resistance memory device as claimed in claim 8, wherein a side surface of the protective film adjacent to the through via includes a concave recess.

14. A variable resistance memory device, comprising:
a substrate;
a peripheral circuit region on the substrate, the peripheral circuit region including a peripheral circuit element and a lower wiring structure connected to the peripheral circuit element;
a cell array region on the peripheral circuit region, the cell array region including first conductive lines extending in a first direction, second conductive lines extending in a second direction intersecting the first direction, and memory cells at intersections of the first conductive lines and the second conductive lines, each of the memory cells including a switching pattern and a variable resistance pattern;
a first via contact which connects the first conductive lines and the lower wiring structure;
a second via contact which connects the second conductive lines and the lower wiring structure;
a protective film which covers an upper surface of the cell array region;
a wiring region on the protective film, the wiring region including an inter-wiring insulating film and an upper wiring structure inside the inter-wiring insulating film; and
a through via which connects the lower wiring structure and the upper wiring structure.

15. The variable resistance memory device as claimed in claim 14, wherein the switching pattern is an ovonic threshold switching (OTS) pattern, and the variable resistance pattern is a phase change pattern in which a resistance value changes depending on a phase change.

16. The variable resistance memory device as claimed in claim 14, wherein the protective film includes at least one of aluminum oxide, silicon nitride, and a combination thereof.

17. The variable resistance memory device as claimed in claim 14, wherein the through via penetrates the protective film.

18. The variable resistance memory device as claimed in claim 14, wherein the first via contact and the second via contact do not penetrate the protective film.

* * * * *